United States Patent [19]

Young et al.

[11] Patent Number: 4,821,173
[45] Date of Patent: Apr. 11, 1989

[54] WIRED "OR" BUS EVALUATOR FOR LOGIC SIMULATION

[75] Inventors: Ronald J. Young, Mesa; Ronald S. Core, Glendale; Joseph T. Marino, Jr., Fountain Hills, all of Ariz.

[73] Assignee: Motorola, Inc., Schaumburg, Ill.

[21] Appl. No.: 168,577

[22] Filed: Mar. 7, 1988

Related U.S. Application Data

[63] Continuation of Ser. No. 879,880, Jun. 30, 1986, abandoned.

[51] Int. Cl.⁴ ................. G06F 15/20; G06F 15/74; G06F 7/544; G06F 9/44
[52] U.S. Cl. ........................... 364/200; 364/900; 364/578; 371/23
[58] Field of Search ... 364/200 MS File, 900 MS File, 364/578; 371/23

[56] References Cited

U.S. PATENT DOCUMENTS

| | | | |
|---|---|---|---|
| 3,939,336 | 2/1976 | Vasiliev et al. | 364/578 X |
| 4,025,902 | 5/1977 | Nakao et al. | 364/900 |
| 4,084,235 | 4/1978 | Hirtle et al. | 364/200 |
| 4,217,658 | 8/1980 | Henry et al. | 364/900 |
| 4,287,563 | 9/1981 | Huston, Jr. | 364/200 |
| 4,306,286 | 12/1981 | Cocke et al. | 364/200 |
| 4,308,616 | 12/1981 | Timoc | 371/23 |
| 4,484,266 | 11/1984 | Becker et al. | 364/200 |
| 4,485,437 | 11/1984 | Kinghorn | 364/200 |
| 4,502,117 | 2/1985 | Kihara | 364/200 |
| 4,551,815 | 11/1985 | Moore et al. | 364/716 |
| 4,583,169 | 4/1986 | Cooledge | 364/300 |
| 4,584,642 | 4/1986 | Fudanuki | 364/200 |
| 4,587,625 | 5/1986 | Marino, Jr. et al. | 364/578 |
| 4,644,487 | 2/1987 | Smith | 364/578 |
| 4,654,851 | 3/1987 | Busby | 371/27 |
| 4,675,865 | 6/1987 | DeVries et al. | 370/85 |
| 4,694,411 | 9/1987 | Burrows | 364/578 |
| 4,697,241 | 9/1987 | Lavi | 364/900 |
| 4,725,971 | 2/1988 | Doshi et al. | 364/578 |
| 4,744,084 | 5/1988 | Beck et al. | 371/23 |

FOREIGN PATENT DOCUMENTS 2164768 3/1986 United Kingdom .

OTHER PUBLICATIONS

Rave et al., "Dynamic Processor Bus LSSD Simulation Modeling Technique", IBM Technical Disclosure Bulletin, vol. 24, No. 7A, Dec. 1981, pp. 3282–3283.

Primary Examiner—Raulfe B. Zache
Assistant Examiner—Danh Phung
Attorney, Agent, or Firm—Jordan C. Powell; Raymond J. Warren

[57] ABSTRACT

The present invention consists of a hardware simulator with bus evaluator logic for use in simulating and fault grading of very large scale digital circuits containing buses. In this invention the status of a bus is continously upgraded each time a primitive is evaluated that has an output coupled to the bus. As bus driver primitives are evaluated, the state of the bus is determined on the fly and stored in an accumulator register, called the bus register. Evaluation of the bus continues using the data stored in the bus register and the state of each driver until all drivers have been evaluated. After the last bus driver is evaluated the state of the bus is known and the bus primitive is assigned the value, or state, stored in the bus register hardware and is passed to all receivers on the bus.

7 Claims, 4 Drawing Sheets

WIRED "OR" BUS EVALUATOR FOR LOGIC SIMULATION

This application is a continuation-in-part, of application Ser. No. 879,880, filed June 30, 1986.

BACKGROUND OF THE INVENTION

The present invention relates, in general, to a processor having an improved architecture which can economically perform simulation and fault grading of very large scale digital circuits and, more particularly, to a bus evaluator that can economically preform simulation and fault grading of wired OR buses contained in very large scale digital circuits.

During the design of very large digital circuits, such as VLSI circuits comprising upwards of 100,000 transistors, it is crucial to have available relatively quick means for simulating the performance of a current version of the structure. One type of hardware simulator is described in U.S. Pat. No. 4,587,625 entitled "PROCESSOR FOR SIMULATING DIGITAL STRUCTURES" developed by Joseph T. Marino, Jr. and Ronald V. Chandos and assigned to the same assignee, Motorola Inc.

One particular problem encountered in any hardware simulator is that of evaluating the bus lines. This is normally performed in one of two basic methods. One method consists of defining the bus as a multiple element structure with pyramidally cascaded models, or primitives. This results in unnecessary processing of the additional primitives; increases the size of the simulation database; and creates unrealistic bus timing in the simulation.

Another method is to simulate a bus by: stopping the processing when a bus is encountered; reading all of the data necessary to evaluate the bus; and continue processing. Either of these methods would require a great deal of processing time and the processing may have to be halted while the decision is being made.

SUMMARY OF THE INVENTION

Accordingly, it is an object of the present invention to provide a bus evaluator that will overcome the above deficiencies.

It is further an object of the present invention to provide a bus evaluator that will evaluate a six state primitive with memory.

Another object of the present invention is to provide a bus evaluator that utilizes a four input primitive.

Still another object of the present invention is to provide a bus evaluator that will not require excessive additional primitives.

Yet another object of the present invention is to provide a bus evaluator that will reduce the processing time.

The above and other objects and advantages of the present invention are provided by the bus simulator described herein.

A preferred embodiment of the present invention comprises a hardware simulator for use with a host computer. The simulator comprises a single, special purpose pipeline processor which simulates a structure described in terms of an advanced primitive. The advanced primitive has four inputs, of a single output and is capable of representing memory cells as well as simpler logic devices. A highly efficient primitive evaluation architecture and bus revolver logic determine the output state of a given primitive in a single clock cycle.

A preferred embodiment of the present invention consists of the addition of bus evaluator logic to a hardware simulator, such as described in U.S. Pat. No. 4,587,625. In operation, a single bus primitive is added to the simulation model wherever a bus is required, a bus being the connection of two or more drivers. As the bus drive primitives are evaluated, the state of the bus is determined on the fly and stored in an accumulator register, called the bus register. Evaluation of the bus continues using the data stored in the bus register and the state of each driver until all drivers have been evaluated. After the last bus driver is evaluated the state of the bus is known and the bus primitive is assigned the value, or state, stored in the bus register hardware and is passed to all receivers on the bus.

DETAILED DESCRIPTION OF THE PREFERRED EMBODIMENTS

Figure 1:
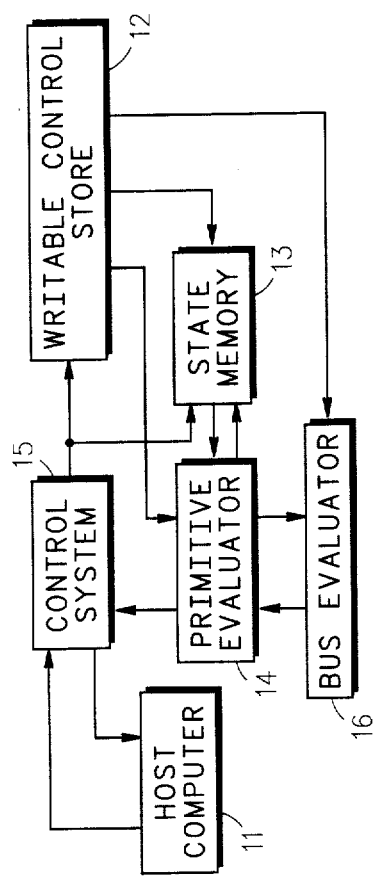
FIG. 1 is a block diagram of a hardware simulator embodying the present invention.

Referring now to FIG. 1, a block diagram of a hardware simulator, generally designated 10, embodying the present invention is illustrated. Simulator 10 is shown being driven by a host computer 11 and is comprised of a writable control store (WCS) 12, a state memory 13, a primitive evaluator 14, a control system 15, and a bus evaluator 16.

Control system 15 controls the running of the simulation by sequentially stepping through the primitives which are used to describe the digital circuit. At each step, controller 15 supplies a sequential address, or primitive number, to writable control store 12. Controller 15 also supplies an evaluation write address to state memory 13. The evaluation write address corresponds to the location in state memory 13 of the node which is at the output of the current primitive being evaluated.

In the preferred embodiment, nodes are identified by the number of the primitive at whose output the node appears. Thus, the evaluation address, which locates the output node of the current primitive, is identical to the primitive number supplied to writable control store 12. When writable control store 12 receives a new primitive number from controller 15, it supplies the read address for the locations in state memory 13 of the nodes which are at the inputs of the current primitive. Writable control store 12 also supplies a primitive type indicator to primitive evaluator 14. Once state memory 13 has received the read address for the inputs of the current primitive from writable control store 12, it reads the current states of those nodes and communicates that information to primitive evaluator 14. Since primitive evaluator 14 now has an indication of the type of the current primitive and the states of all of the inputs thereof, it can evaluate the current state of the output. It should be noted here that processing in the different areas is simultaneous, although on different primitives.

Figure 2:
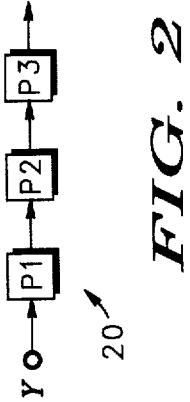
FIG. 2 is a model of a primitive circuit to be evaluated.

In operation, host computer 11 generates an 80 bit data word for each primitive in the circuit to be evaluated. The 80 bit data word consists of the primitive type and the primitive numbers driving each input. For example, in evaluating a circuit 20 of FIG. 2, three primitives (P1-P3) would be compiled by the host computer. The data identifying this circuit would then be input into WCS 12. This data would appear as shown in Table 1.

TABLE 1

| ID | WRITABLE CONTROL STORE | | | |
|----|-----|-----|-----|-----|
|    | IN1 | IN2 | IN3 | IN4 |
| P1 | Y   | —   | —   | —   |
| P2 | P1  | —   | —   | —   |
| P3 | P2  | —   | —   | —   |

This data contains five fields of information, the ID field and four input fields, since each primitive is allowed four inputs. The ID field contains data as to the type of primitive and various control and flag setting control data. One type of ID field is shown below.

| 15 | 14 | 13 | 12 | 11 | 10 | 9 | 8 7 6 5 4 3 2 1 0 |
|----|----|----|----|----|----|---|-------------------|
| L  | B  | R  | B  | O  | F  | C | TYPE              |

In this ID field bits 0–8 repesent the primitive type; bits 9 and 10 are fault control bits, bit 11 is the output flag, when this flag is set the evaluated state of the primitive is passed to the host for display; bit 12 is a break point bit, by setting this execution can be suspended after the primitive is evaluated; bits 13 and 14 determine if the bus evaluator should be used or not (whether the primitive is coupled to a bus); and bit 15 is the last primitive flag, this terminates a simulation pass.

The input fields contain the primitive numbers of the primitives which drive each of the four inputs and which are used as addresses by state memory 13. As shown here, primitives P1—P3 only have one input, IN1.

When a simulation is commenced, circuit 20 is evaluated by changing the Y input. This change is made by host computer 11 and is generally the present state of the Y input. The primitive number of primitive P1 is used as an address in WCS 12 to look up the outputs of the devices listed in IN1-IN4. As shown here IN1 is the Y primitive. This information is then transferred to primitive evaluator 14 along with the ID information of primitive P1. Primitive P1 is then evaluated and the new output of P1 is transmitted to control system 15 which will write the result back into state memory 13.

Next, primitive P2 is evaluated for the same time period. At this time the current output from P1 has not been updated, so when P2 is evaluated there has been no change in its input and therefor no change in its output. Finally, P3 is evaluated and, since the output of P2 has not changed, there is no change in the input or output of P3.

Since P3 is the last primitive, control system 15 will check to see if any primitive changed state on the previous pass. This can be accomplished by matching the present outputs with the previous outputs. Assuming that the output of P1 did change the process is repeated. First, P1 is again analyzed, since the Y input has not changed on this pass, P1 does not change. Next, P2 is analyzed. At this point the input to P2 has been updated in state memory 13 and the output of P2 may change as a result of this. Finally P3 is again evaluated, however, as above, the output of P2 has not been updated so there is no change in P3. This process of evaluating repeats until no changes are detected in the circuit, between the present output and the previous output, for a full evaluation cycle.

Figure 3A:
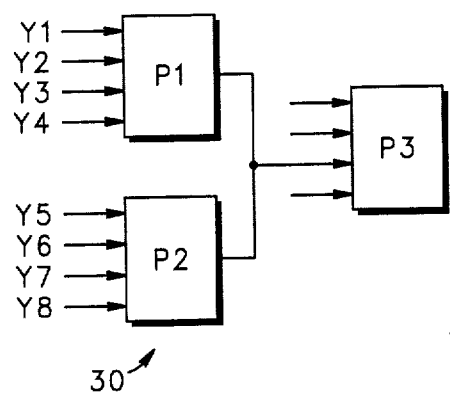
FIGS. 3A and 3B are models of bus primitives to be evaluated.

The above description is a very basic description of how simulator 10 functions. The main function of the present invention is to evaluate buses that are contained in the circuit being analyzed. A bus 30 is shown in FIG. 3A, here outputs of primitives P1 and P2 are coupled to one input of primitive P3. This can not be evaluated in the same manner as above since there are two outputs being coupled to the same input. To evaluate this an extra primitive E1 would have to be added, as shown in circuit 35, FIG. 3B. The writable control store for this would appear as shown below in Table 2.

TABLE 2

| ID | WRITABLE CONTROL STORE | | | |
|----|-----|-----|-----|-----|
|    | IN1 | IN2 | IN3 | IN4 |
| P1 | Y1  | Y2  | Y3  | Y4  |
| P2 | Y5  | Y6  | Y7  | Y8  |
| E1 | P1  | P2  | —   | —   |
| P3 | E1  | —   | —   | —   |

When circuit 35 is evaluated, primitives P1 and P2 would be updated on the first evaluation pass; E1 on the second evaluation pass; and P3 on the third evaluation pass. This type of evaluation has the drawback of requiring one extra primitive and one extra evaluation pass, thereby wasting processing time by requiring an extra delay in the path.

Figure 4:
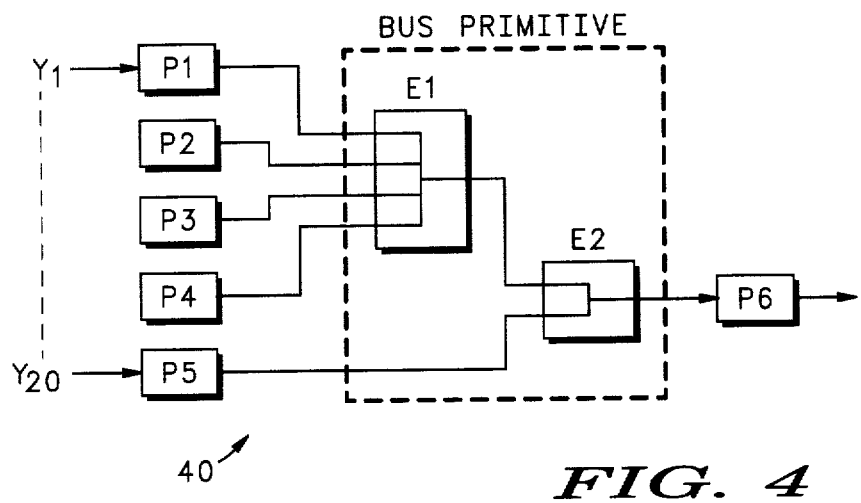
FIG. 4 is a model of a second bus to be evaluated.

In FIG. 4 a second bus 40 is illustrated. Bus 40 has the output of five primitives (P1-P5) coupled to one input of primitive P6. In order to model this, two extra primitives (E1 and E2) are required. This would have a WCS input as shown in Table 3.

TABLE 3

| ID | WRITABLE CONTROL STORE | | | |
|----|-----|-----|-----|-----|
|    | IN1 | IN2 | IN3 | IN4 |
| P1 | Y1  | Y2  | Y3  | Y4  |
| P2 | Y5  | Y6  | Y7  | Y8  |
| P3 | Y9  | Y10 | Y11 | Y12 |
| P4 | Y13 | Y14 | Y15 | Y16 |
| P5 | Y17 | Y18 | Y19 | Y20 |
| E1 | P1  | P2  | P3  | P4  |
| E2 | E1  | P5  | —   | —   |
| P6 | E2  | —   | —   | —   |

To evaluate bus 40, a minimum of four evaluation passes are required: primitives P1-P5 on the first pass; E1 on the second pass; E2 on the third pass; and P6. on the fourth pass. Circuit 40 would then require two additional primitives and two additional evaluation passes.

Figure 5:
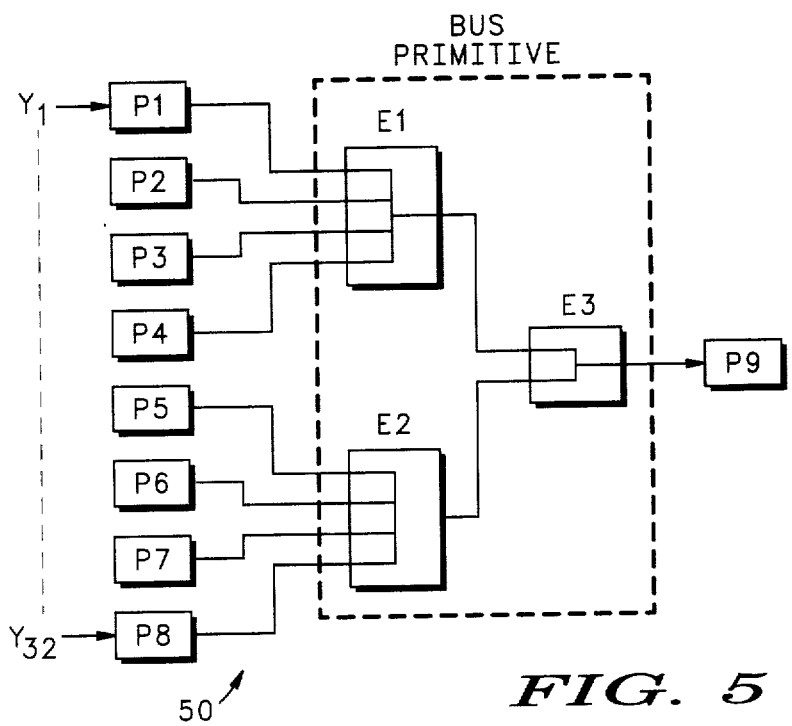
FIG. 5 is a model of a third bus to be evaluated.

Finally, in FIG. 5 a bus model, generally designated 50, is illustrated. Bus 50 has eight lines being coupled to a single input line. The WCS for model 50 is shown in Table 4.

TABLE 4

| | WRITABLE CONTROL STORE | | | |
|---|---|---|---|---|
| ID | IN1 | IN2 | IN3 | IN4 |
| P1 | Y1 | Y2 | Y3 | Y4 |
| P2 | Y5 | Y6 | Y7 | Y8 |
| P3 | Y9 | Y10 | Y11 | Y12 |
| P4 | Y13 | Y14 | Y15 | Y16 |
| P5 | Y17 | Y18 | Y19 | Y20 |
| P6 | Y21 | Y22 | Y23 | Y24 |
| P7 | Y25 | Y26 | Y27 | Y28 |
| P8 | Y29 | Y30 | Y31 | Y32 |
| E1 | P1 | P2 | P3 | P4 |
| E2 | P5 | P6 | P7 | P8 |
| E3 | E1 | E2 | — | — |
| P9 | E3 | — | — | — |

To evaluate model 50, a minimum of four evaluation passes would be required: primitives P1-P8 on the first pass; E1 and E2 on the second pass; E3 on the third pass; and P9 on the fourth pass. This requires an additional three primitives and two passes for model 50. As the number of bus drivers increases more and more extra primitives and extra delays (evaluation passes) are required.

Figure 3B:
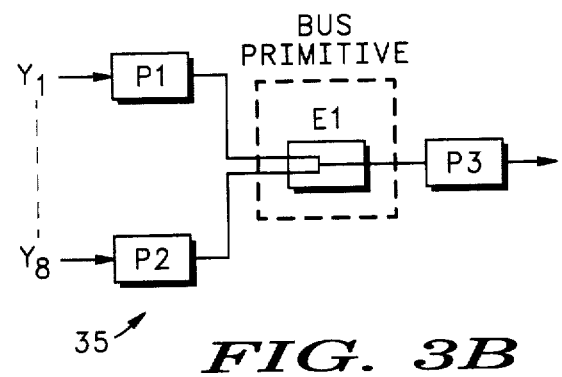

The present invention consists of replacing all of the extra primitives with an advanced bus primitive (BP) as shown in the dotted lines in FIGS. 3B., 4 and 5. This advanced bus primitive does not require any additional processing pass and only requires the addition of one bus primitive in the WCS as shown in Table 5 for model 50.

| | WRITABLE CONTROL STORE | | | |
|---|---|---|---|---|
| ID | IN1 | IN2 | IN3 | IN4 |
| P1 | Y1 | Y2 | Y3 | Y4 |
| P2 | Y5 | Y6 | Y7 | Y8 |
| P3 | Y9 | Y10 | Y11 | Y12 |
| P4 | Y13 | Y14 | Y15 | Y16 |
| P5 | Y17 | Y18 | Y19 | Y20 |
| P6 | Y21 | Y22 | Y23 | Y24 |
| P7 | Y25 | Y26 | Y27 | Y28 |
| P8 | Y29 | Y30 | Y31 | Y32 |
| BP | XX | XX | XX | XX |
| P9 | BP | — | — | — |

The evaluation of model 50 using Table 5 would proceed as follows. First P1 is evaluated using primitive evaluator 14. As part of the ID definition of P1 a flag is set that designates the output as a bus driver, which is an input of a bus primitive (BP). Therefore, once P1 has been evaluated the output goes to control 15 and to bus evaluator 16. The output is then simultaneously processed by control 15, as a standard primitive would, and by bus evaluator 16.

Bus evaluator 16 operates to keep a running tab on the present state of the bus primitive (BP). This is accomplished according to the state diagram shown in FIG. 6. The state of BP is set to an initial default value prior to processing. This default value can be set by the user through host computer 11.

Figure 6:
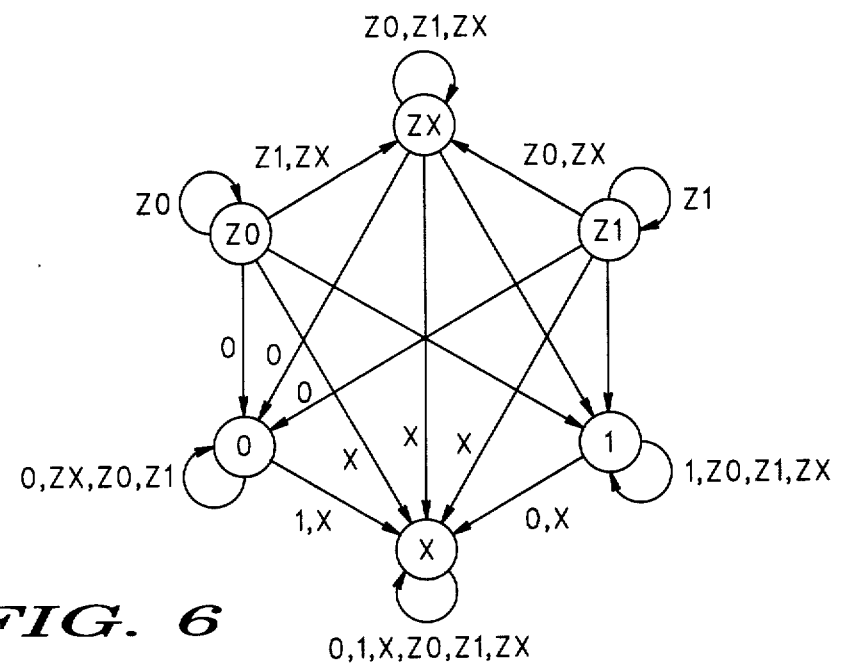
FIG. 6 is a state diagram representing the operation of the present invention.

There are six possible states as set out in FIG. 6. These are defined as: a hard 0 (0), a hard 1 (1), a hard X (X), a soft 0 (Z0), a soft 1 (Z1), and a soft X (ZX). The hard values are generally provided by a circuit actively driving a line, such as a driver, an OR gate, etc. The soft values are passively driving a line, such as memory circuits. The X value indicates that the value to which the line is being driven is unknown. Initially, the default state will be set to the primitive's previous state, the previous primitive's present state, Z0, Z1, or ZX.

If the initial default value in bus evaluator 16 is set to Z0 and primitive P1 is evaluated to provide a Z1 output, then the state value contained in bus evaluator 16 is updated to ZX. This is because the value of the input to BP is unknown since neither Z0 nor Z1 is dominant. Next, primitive P2 is evaluated. Since the output of P2 is an input to BP, the result of the evaluation is processed by bus evaluator 16 as well as control 15. If the output of P2 is assumed to be a 1, then bus evaluator 16 transitions to a 1 from the ZX state as shown in the state diagram. The output of BP will transition to 1 here since a hard value is dominant over a soft value. Next, primitive P3 is evaluated in the same manner. Assuming that the output of P3 is designated 0 the state diagram indicates that the BP output transitions to a hard X. This results because two drivers driving opposite data unto the bus yields an unknown value (X). As can be determined from an examination of FIG. 6, once the state reaches hard X there is no value that can change it.

Once primitives P1-P8 have been evaluated the state of the BP output has been determined and is held in bus evaluator 16. Next, primitive BP is evaluated. As shown in Table 5 the inputs to BP are don't cares because they are not used. In place of the normal evaluation for a primitive the state held in the bus evaluator is passed to control system 15 and state memory 13.

A benefit of this method allows BP to be evaluated and its output updated on the same evaluation pass that evaluates and updates primitives P1-P8. This then would allow the modeling of a bus with the addition of only one primitive and with no additional evaluation passes (unit delays).

Figure 8:
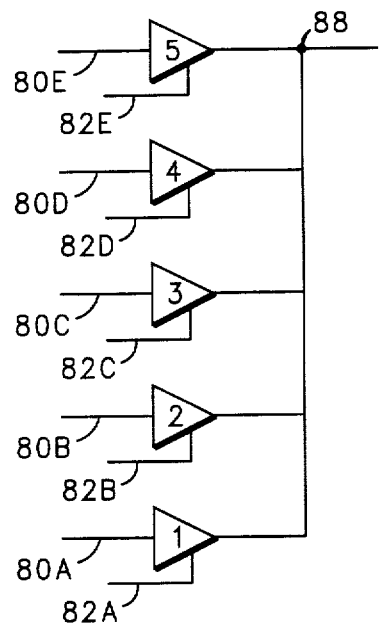
FIG. 8 is a schematic diagram of a wired "OR" bus to be simulated by the present invention.
Figure 9:
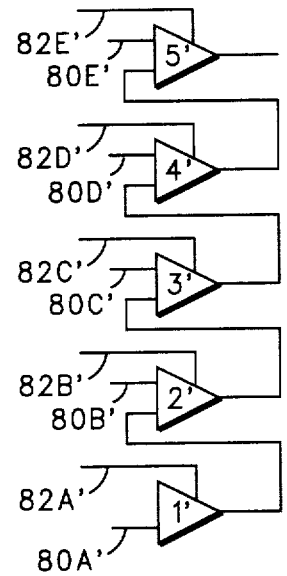
FIG. 9 is an illustration of a modeling process as performed by U.S. Pat. No. 4,587,625.
Figure 10:
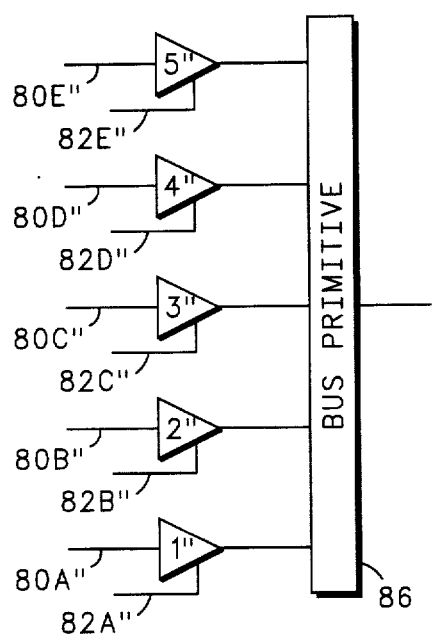
FIG. 10 is a schematic diagram of a wired "OR" bus modeling process according to the present invention.

FIG. 8 shows a wired "OR" bus to be simulated by the present invention. The state of each bus driver primitive in the wired "OR" bus may change by a change in data pins 80a through 80e or enable pins 82a through 82e. FIGS. 9 and 10 illustrate the wired "OR" bus modeling process as performed by U.S. Pat. No. 4,587,625 and the present invention respectively. In FIG. 9, an input change in driver 1' from data pin 80a' or enable pin 82a' is evaluated only in driver 1' on the first pass. On the second pass, the output from updated driver 1' is evaluated in driver 2'. The updated data is fed up through each driver in the same manner in succeeding passes, causing a total of 5 passes or unit delays to simulate a bus. In FIG. 10, each bus driver primitive is coupled to bus primitive 86. Bus primitive 86 represents wire "OR" node 88, shown in FIG. 8, and is evaluated by bus evaluator logic 74 and accumulator 75 according to the state transition diagram in FIG. 6. When an input change is entered into driver 1" from data pin 80a", or enable pin 82a", drivers 1" through 5", and therefore bus primitive 86, are resolved in the same single pass. By decreasing the number of passes to one, the time for modeling is substantially reduced and the modeling accuracy is increased.

Figure 7:
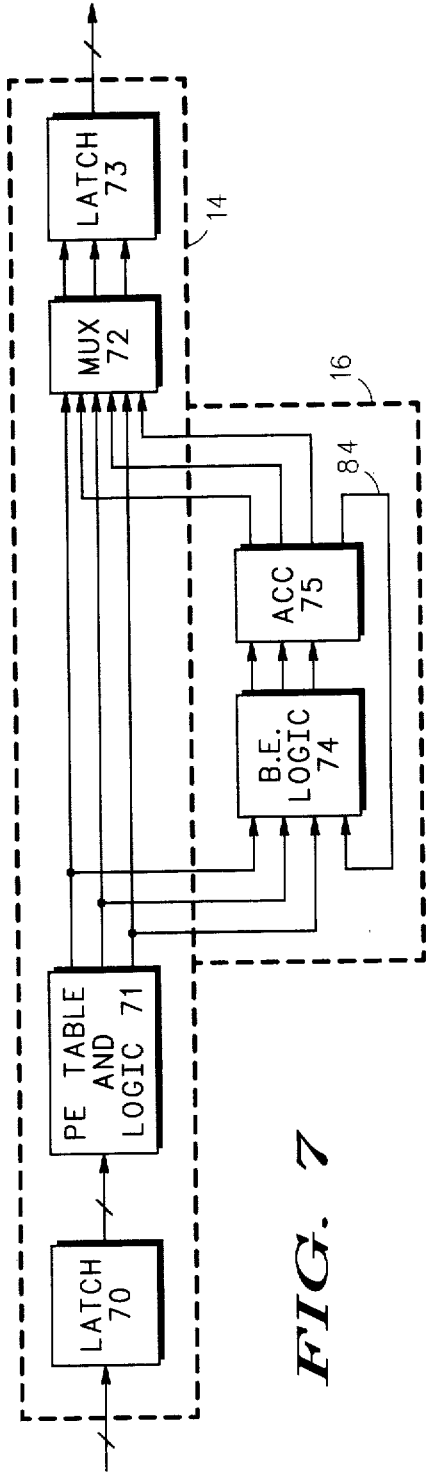
FIG. 7 is a more detailed block diagram of a portion of the hardware simulator of FIG. 1.

Referring now to FIG. 7, a more detailed block diagram of the primitive and bus evaluators of FIG. 1 are illustrated. Primitive evaluator 14 is represented by a latch 70, a primitive evaluator table and logic circuit 71, a multiplexer 72, and a latch 73. Bus evaluator 16 is shown comprised of a bus evaluator logic circuit 74 and an accumulator 75.

In operation, a primitive type and four inputs are loaded into latch 70 from WCS 12 and state memory 13. The information from WCS 12 is from the ID field of the primitive. This ID field is used by primitive evaluation table 71 to determine how to evaluate the primitive. The input fields from WCS 12 are transmitted to state memory 13 which provides the input values of the primitive to latch 70.

The primitive is then evaluated in circuit 71. If the primitive output is not flagged as a bus primitive output, the output of circuit 71 is transmitted to multiplexer 72, which passes the data to latch 73. This data consists of the present value bit (0 or 1); the present Z bit, whether the state is hard or soft; and the present X bit, whether the state is known or unknown (this will override the present value). If the output of the primitive is used as an input to a bus, a bus driver flag from writable control store 12 is sent to bus evaluator logic 74 to load the output of circuit 71 into the bus evaluator logic circuit 74, in addition to latch 73. This input is then evaluated, given the present data on the bus, providing new bus data which is updated in accumulator 75. The data stored in accumulator 75 is the current state of the bus primitive which is made available to bus evaluator logic 74 through feedback path 84. This data stored in accumulator 76 is used in conjunction with the output data from circuit 71 to determine a new state of the bus primitive which will then be stored in accumulator 75. For example, when a first bus driver primitive is entered into bus evaluator 16, it is evaluated in bus evaluator logic 74 with a current bus primitive state from accumulator 74 according to the state table found in FIG. 6 to produce a new state of the bus primitive. This new state is then entered and stored in accumulator 75. A second bus driver primitive is then entered into bus evaluator 74 which is evaluated with the new state of the bus primitive fed back along line 84 from accumulator 75. A new state of the bus primitive is then produced according to the state table in FIG. 6 and the new state is stored in accumulator 75.

When a BP primitive is evaluated, a signal is sent from writable control store 12 to multiplexer 72 and the output from accumulator 75 is passed to latch 73 instead of the output of circuit 71. At this point the control circuit can immediately update the output of BP in state memory 13. This allows the next bus primitive to be evaluated and makes the present state data available for receivers of the bus on the next evaluation pass. This results in the bus represented by BP being evaluated without requiring an extra evaluation pass or unit delay. This then results in a time saving in evaluating a circuit which translates to an economic benefit.

Thus, it is apparent to one skilled in the art that there has been provided in accordance with the invention, a device and method that fully satisfies the objects, aims and advantages set forth above.

It has been shown that the present invention provides a bus evaluator that does not require excessive additional primitives and reduces the processing time.

While the invention has been described in conjunction with specific embodiments thereof, it is evident that many alterations, modifications, and variations will be apparent to those skilled in the art in light of the foregoing description. Accordingly, it is intended to embrace all such alterations, modifications and variations in the appended claims.

We claim:

1. A wired "OR" bus evaluator for modeling a wired "OR" bus in a digital circuit comprising:

writable control store means for storing a description of said digital circuit in terms of a list of primitives and interconnections between said primitives;

state memory means for storing present and previous state data;

said state memory means coupled to said writable control store means to receive at least one input state read addresses therefrom corresponding to a current primitive;

primitive evaluator means coupled to said state memory means to receive at least one input state therefrom and to said writable control store means to receive a primitive type indicator therefrom;

said primitive evaluator means for producing evaluator output states of each of said primitives;

host computer means coupled to said state memory means through a control means to provide an initial state thereto;

said control means coupled to said writable control store for providing a primitive number thereto and to said host computer for relaying a final evaluator output;

bus evaluator means coupled to said primitive evaluator means, said bus evaluator means for comparing said evaluator outputs with a current bus primitive state to produce a new bus primitive state and for transmitting said new bus primitive state to said state memory means to update said state memory means.

2. A wired "OR" bus evaluator for modeling a wired "OR" bus in a digital circuit comprising:

writable control store means for storing a description of said digital circuit in terms of a list of primitives and interconnections between said primitives;

state memory means for storing present and previous state data;

said state memory means coupled to said writable control store means to receive at least one input state read address therefrom corresponding to a current primitive;

primitive evaluator means coupled to said state memory means to receive at least one input state therefrom and to said writable control store means to receive a primitive type indicator therefrom;

said primitive evaluator means for producing evaluator output states of each of said primitives;

host computer means coupled to said state memory means through a control means to provide an initial state thereto;

said control means coupled to said writable control store for providing a primitive number thereto and to said host computer for relaying a final evaluator output;

bus evaluator means coupled to said primitive evaluator means for receiving said evaluator outputs therefrom and for providing a bus primitive state thereto;

said bus evaluator means comprises bus evaluator logic means coupled to accumulator means;

said bus evaluator logic means for receiving said evaluator outputs from said primitive evaluator and a current bus primitive state from said accumulator to produce a new bus primitive state; and said accumulator means for receiving and storing said new bus primitive state, for feeding said new bus primitive state back to said bus evaluator means, to update said state memory means.

3. A wired "OR" bus evaluator for modeling a wired "OR" bus in a digital circuit comprising:
- writable control store means for storing a description of said digital circuit in terms of a list of primitives and interconnections therebetween;
- said writable control store means having an input, a first output, a second output, and a third output;
- state memory means for storing present and previous state data;
- said state memory means having a first input coupled to said first output of said writable control store means, a second input, a third input, and an output;
- primitive evaluator means for receiving at least one input state and a primitive type indicator and producing an evaluator output;
- said primitive evaluator means having a first input coupled to said second output of said writable control store means, a second input, a third input coupled to said output of said state memory means, a first output coupled to said third input of said state memory means, a second output, and a third output;
- host computer means for supplying an initial input state of said list of primitives;
- said host computer means having an output and an input;
- control means for sequentially stepping through said list of primitives;
- said control means having a first input coupled to said output of said host computer means, a second input coupled to said third output of said primitive evaluator means, a first output coupled to said input of said writable control store means and to said second input of said state memory means, and a second output coupled to said input of said host computer;
- bus evaluator means having a first input coupled to said second output of said primitive evaluator, a second input coupled to said third output of said writable control store means, and an output coupled to said second input of said primitive evaluator;
- said bus evaluator means for comparing bus inputs received from said primitive evaluator with a bus primitive state from said bus evalutor means to produce a new bus primitive state.

4. A wired "OR" bus evaluator according to claim 3 wherein said bus evaluator comprises;
- a bus evaluator logic means coupled to an accumulator means and a feed-back means coupled to said bus evaluator logic means and said accumulator means;
- said bus evaluator logic means for receiving said bus inputs and said bus primitive state from said feed-back means and for producing said new primitive state;
- said accumulator means for storing said bus primitive state and said new bus primitive state; and
- said feed-back means for feeding said new bus primitive state to said bus evaluator logic means from said accumulator means to update said state memory means.

5. A bus primitive single pass evaluator for modeling a wired "OR" bus in a digital circuit comprising:
- writable control store means for storing a description of said digital circuit in terms of a list of primitives and interconnections therebetween;
- said writable control store means having an input, a first output, a second output, and a third output;
- state memory means for storing present and previous state data;
- said state memory means having a first input coupled to said first output of said writable control store means, a second input, a third input, and an output;
- primitive evaluator means for receiving at least one input state and a primitive type indicator and producing an evaluator output;
- said primitive evaluator means having a first input coupled to said second output of said writable control store means, a second input, a third input coupled to said output of said state memory means, a first output coupled to said third input of said state memory means, a second output, and a third output;
- host computer means for supplying an initial input state of said list of primitives;
- said host computer means having an output and an input;
- control means for sequentially stepping through said list of primitives;
- said control means having a first input coupled to said output of said host computer means, a second input coupled to said third output of said primitive evaluator means, a first output coupled to said input of said writable control store means and to said second input of said state memory means, and a second output coupled to said input of said host computer;
- bus evaluator means for receiving bus inputs and providing a new bus primitive state;
- said bus evaluator having a bus evaluator logic means, a feed-back means, and an accumulator means;
- said bus evaluator logic means for producing said new bus primitive state from said bus inputs and a current bus primitive state;
- said bus evaluator logic means having a first input coupled to said second output of said primitive evaluator, a second input coupled to said third output of said writable control store means, a third input, and an output;
- said accumulator means for storing said current bus primitive state and said new bus primitive state;
- said accumulator means having an input coupled to said output of said bus evaluator logic means, a first output, and a second output coupled to said second input of said primitive evaluator;
- said feed-back means for feeding said current bus primitive state to said bus evaluator logic means from said accumulator means; and
- said feed-back means having an input coupled to said first output of said accumulator means and an output coupled to said third input of said bus evaluator logic means.

6. A method of modeling a wired "OR" bus in a digital circuit in a single pass comprising the steps of:
- loading a set of data relating to first and second bus driver primitives to a first memory;
- loading an ID data field of said first bus driver primitive from said first memory to a primitive evaluator;
- loading an input of said first bus driver primitive from a second memory to said primitive evaluator;
- producing a first bus driver state in said primitive evaluator from said ID data field and said input of said first bus driver primitive;
- transmitting said first bus driver state to a bus evaluator and to said second memory;

producing a first bus primitive state in said bus evaluator from said first bus driver state and a current bus primitive state;
loading an ID data field of said second bus driver primitive from said first memory to said primitive evaluator;
loading an input of said second bus driver primitive from said second memory to said primitive evaluator;
producing a second bus driver state in said primitive evaluator from said ID data field and said input of said second bus driver primitive;
transmitting said second bus driver state to said bus evaluator and to said second memory;
producing a second bus primitive state in said bus evaluator from said second bus driver state and said first bus primitive state;
loading a flag ID data field of said bus primitive from said first memory to said bus evaluator; and
transmitting said second bus primitive state from said bus evaluator to said second memory.

7. A method of modeling a wired "OR" bus in a digital circuit in a single pass comprising the steps of:
loading a set of data relating to first and second bus driver primitives to a first memory;
loading an ID data field of said first bus driver primitive from said first memory to a primitive evaluator;
loading an input of said first bus driver primitive from a second memory to said primitive evaluator;
producing a first bus driver state in said primitive evaluator from said ID data field and said input of said first bus driver primitive;
transmitting said first bus driver state to a bus evaluator logic element and to said second memory;
producing a first bus primitive state in said bus evaluator logic element from said first bus driver state and a current bus primitive state;
loading said first bus primitive state into an accumulator;
loading an ID data field of said second bus driver primitive from said first memory to said primitive evaluator;
loading an input of said first bus driver primitive from said second memory to said primitive evaluator;
producing a second bus driver state in said primitive evaluator from said ID data field and said input of said second bus driver primitive;
transmitting said second bus driver state to said bus evaluator logic element and to said second memory;
loading said first bus primitive state from said accumulator to said bus evaluator logic element;
producing a second bus primitive state in said bus evaluator logic element from said second bus driver state and said first bus primitive state;
loading said second bus primitive state into said accumulator;
loading a flag ID data field of said bus primitive from said first memory to said primitive evaluator;
loading said second bus primitive state to said primitive evaluator from said accumulator; and
transmitting said second bus primitive state from said primitive evaluator to said second memory.

* * * * *

UNITED STATES PATENT AND TRADEMARK OFFICE
CERTIFICATE OF CORRECTION

PATENT NO. : 4,821,173

DATED : April 11, 1989

INVENTOR(S) : Ronald J. Young et al.

It is certified that error appears in the above-identified patent and that said Letters Patent is hereby corrected as shown below:

In column 8, claim 1, line 8, delete the word "addresses" and insert --address--.

Signed and Sealed this

Twenty-first Day of November, 1989

Attest:

JEFFREY M. SAMUELS

Attesting Officer     Acting Commissioner of Patents and Trademarks